United States Patent [19]

Schelhorn

[11] 4,417,296

[45] Nov. 22, 1983

[54] METHOD OF CONNECTING SURFACE MOUNTED PACKAGES TO A CIRCUIT BOARD AND THE RESULTING CONNECTOR

[76] Inventor: Robert L. Schelhorn, 270 Locust La., Cinnaminson, N.J. 08077

[21] Appl. No.: 190,985

[22] Filed: Oct. 26, 1980

Related U.S. Application Data

[63] Continuation-in-part of Ser. No. 59,991, Jul. 23, 1979, abandoned.

[51] Int. Cl.³ .............................................. H05K 1/18
[52] U.S. Cl. .................................... 361/386; 29/832; 29/834; 361/381; 361/403; 361/406
[58] Field of Search ............... 361/386, 388, 401, 406, 361/403, 386, 388; 174/52 PE; 29/832, 834

[56] References Cited

U.S. PATENT DOCUMENTS

| | | | |
|---|---|---|---|
| 3,141,998 | 7/1964 | Silkman | 361/386 X |
| 3,259,804 | 7/1966 | Parstorfer | 361/386 X |
| 3,311,790 | 3/1967 | Vizzier | 361/386 X |
| 3,346,773 | 10/1967 | Lomerson | 361/386 |
| 3,495,023 | 2/1970 | Hessinger | 361/388 X |
| 3,591,839 | 7/1971 | Evans | 174/52 PE X |
| 3,621,112 | 11/1971 | Stickely | 174/50.52 |
| 4,195,195 | 3/1980 | Miranda | 361/406 X |

OTHER PUBLICATIONS

S. K. Wadha, Low-Cost Circuit Packaging, IBM, Tech. Disc. Bull., V. 22 #2, Jul. 1979, p. 522.
W. B. Archey, Water Cooling Plate for Card on Board Packages, IBM Tach. Discl. Bull., vol. 19 #2, Jul. 1976, p. 412 & 413.
E. Berndlmaier, Chip Perimeter Cooling Band, IBM Tech. Discl. Bull., vol. 21 #11 Apr. 1979, p. 4483 & 4484.

*Primary Examiner*—R. R. Kucia

[57] ABSTRACT

A method (and the resulting article) comprises the step of providing a surface mounted package connector including a thermal buffer pad. Preferably the surface mounted package is mounted on a circuit board having preselected circuitry thereon. The present method provides a mounting capable of withstanding severe temperature cycling and thermal shocks.

17 Claims, 5 Drawing Figures

METHOD OF CONNECTING SURFACE MOUNTED PACKAGES TO A CIRCUIT BOARD AND THE RESULTING CONNECTOR

This is a continuation-in-part of U.S. patent application Ser. No. 059,991 filed July 23, 1979, now abandoned.

The present invention generally relates to a method of connecting a surface mounted package to a circuit board and the resulting connector.

Surface mounted packages, i.e., packages which do not have leads protruding therefrom but instead have contacts which extend onto the bottom, or mounting surface, are widely used, and are particularly useful where hermeticity is required. It is common practice to secure surface mounted packages onto a circuit board, such as, for example, what is commonly known as a printed circuit board (hereinafter referred to as PCB) by soldering only the contact portions, or pads, extending across the bottom surface of the package to a corresponding pattern of contacts on the PCB. Thus, these pads and their bonds provide both the physical attachment and the electrical connections between the package and the circuit board.

The major problem of connecting a surface mounted package to a circuit board in general is that the solder bond between the contacts of the package and the corresponding contacts of the circuit board often fracture under thermal stress. This is in contrast to devices which are attached to circuit boards via wire leads, wherein the leads are sufficiently flexible that they easily absorb thermal stresses. It is believed that the above mentioned fractures are caused by the difference between the coefficients of thermal expansion of the dissimilar materials at the mounted interface. That is, the package, usually being ceramic, expands at one rate per thermal degree and the PCB, for example, being glass epoxy or polyimide, expands at a different rate per thermal degree. This difference in expansion rates creates forces at the bond between the mounting pads which are greater than the strength of the bond.

In accordance with one embodiment of the present invention, a connector for securing a surface mounted package having a first plurality of electrical contact pads on one surface thereof to a circuit board having a second plurality of electrical contact pads includes a large thermal buffer pad on said surface mounted package and on said circuit board and means for bonding said thermal buffer pads together and said contact pads together.

In the drawing, which is not drawn to scale:

Figure 1:
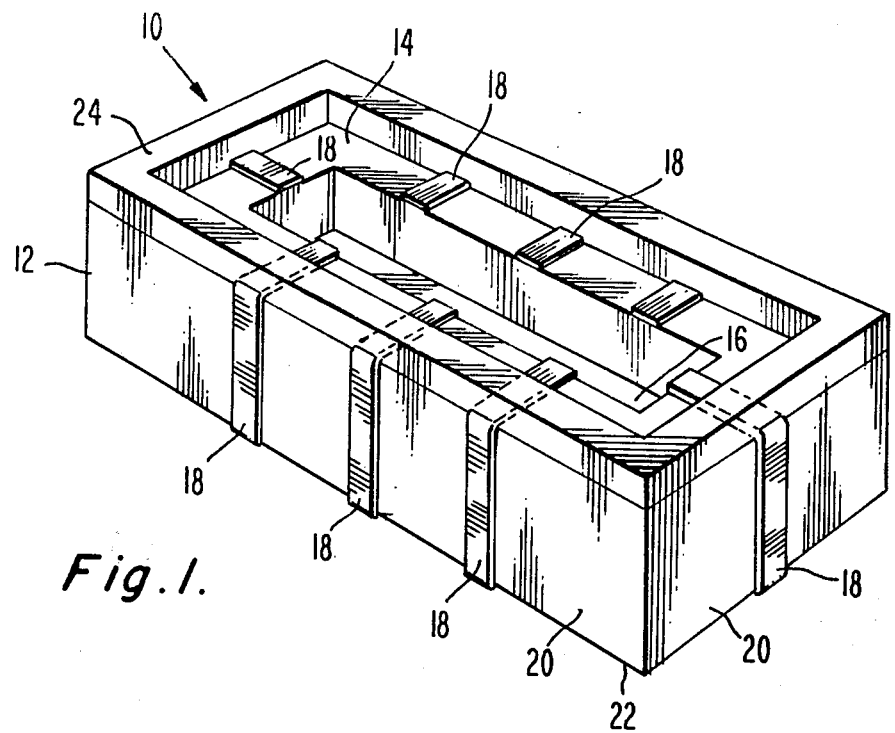
FIG. 1 is a perspective view of a surface mounted package useful in a method of mounting same, embodying the principles of the present invention.

Referring to FIG. 1 there is shown a surface mounted package 10 having a ceramic base 12. The base 12, usually comprised of alumina, has a first surface 14 and a cavity 16 extending thereinto. The cavity 16 is sized to contain preselected electronic elements, not shown in the drawing. The package 10 includes a plurality of wrap-around contacts 18 which extend from the surface 14, usually from the periphery of the cavity 16, along sides 20 and onto a second surface 22 opposite from and substantially parallel to the first surface 14. The contacts 18 usually comprise a multi-layer structure of electrically conductive material, such as tungsten, with a layer of nickel thereover and a gold overcoat, and are distributed around the periphery of the base 12 in a predetermined configuration. In one specific embodiment, for example, the contacts 18 are about 0.05 centimeters wide and are distributed on about 0.1 centimeter centers. The contact pads 18 constitute a connector for connecting surface mounted packages to the printed circuit board.

The package 10 also includes a ceramic rim 24 which overlies and is contiguous with the periphery of the first surface 14. The ceramic rim 24 is usually formed while the base 12 is in its green state, i.e. unfired, and is fired with the base 12 so that it hermetically seals the wrap-around contacts 18 thereunder. The rim 24 leaves a portion of the first surface 14 surrounding the cavity 16 and the contacts 18 extending to the periphery thereof exposed. A lid, not shown in the drawing, can be bonded, for example, by using known soldering techniques, to the rim 24 to hermetically encase the electronic element in the cavity 16.

Figure 2:
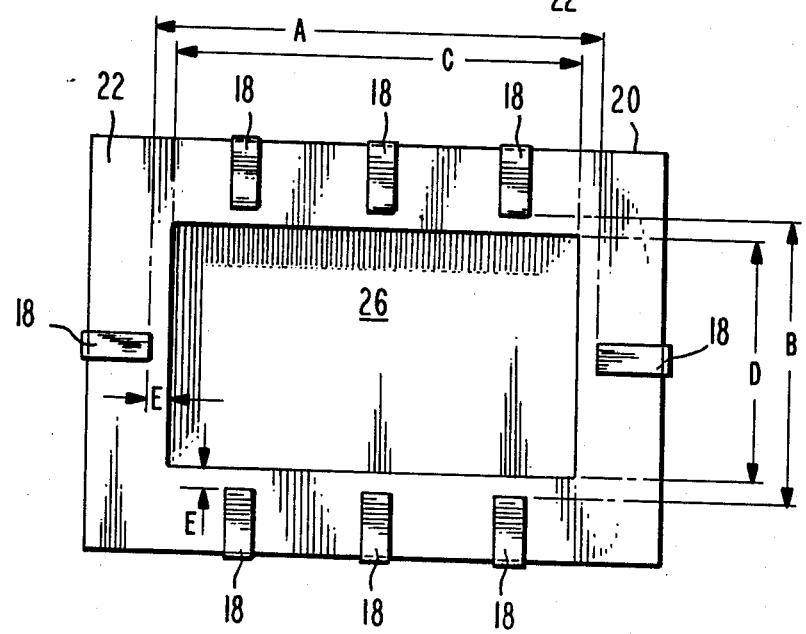
FIG. 2 is a plan view of the mounting surface of the package shown in FIG. 1 at an intermediate stage of a mounting method embodying the principles of the present invention.

Using the package 10, as described above, as a workpiece, the initial step of the novel method is the formation of a thermal buffer pad 26 on the second surface 22. Pad 26 preferably has a coefficient of thermal expansion between that of the package 12 and that of the surface to which it is to be mounted. Thermal buffer pad 26 is preferably centrally located within the pattern of bonding pads of the package, that is, it is preferably within an area enclosed by the electrical contact pads and is preferably disposed in close proximity to the electrical contact pads. Thermal buffer pad 26 is preferably much larger than the electrical contact pads. The bonding area of the thermal buffer pad should be at least five and preferably ten or more times as large as the bonding area of an electrical contact pad in order to assure the buffer pad's success in preventing the facture of electrical contact pad bonds. The thermal buffer pad 26 is preferably spaced from the electrical contact pads by a distance E, in accordance with the design rules of the system, in order that the electrical contact pads may be in close proximity to the thermal buffer pad without inducing undesired short circuits. Referring to FIG. 2, the thermal buffer pad 26 is shown spaced a distance E from the contacts 18. This configuration ensures that the thermal buffer pad 26 is electrically isolated from the contacts 18. Preferably, the thermal buffer pad 26 is spaced from the contacts 18 by at least about 0.1 centimeters. For a package such as that in FIG. 2 having the distance A between the opposite end pads about 1.0 centimeters and the distance between opposite side pads B about 0.8 centimeters, C the length of the thermal buffer pad 26 is preferably about 0.8 centimeters and D, its width is preferably about 0.6 centimeters.

Although other materials can be used, it has been determined that copper is most preferable for use as the thermal buffer pad 26. One reason copper is preferred is that it is compatible with known thick film printing techniques. One particular technique for forming the thermal buffer pad 26 includes silk screening the pad 26 using a preselected mask to confine the pad 26 to its desired location and thereafter firing the copper at a temperature of between about 550° C. to 600° C. for about ten minutes. Preferably the thermal buffer pad 26 is formed to substantially the same thickness as the contact pads. This is preferably between about 5 and about 10 micrometers. Another reason copper is preferred is that its firing temperature is below that at which significant interdiffusion between the gold and nickel layers of the contacts 18 occurs. Hence, the forming of the copper thermal buffer pad 26 on the ceramic base 12 does not significantly affect the electrical characteristics of the contacts 18.

Figure 3:
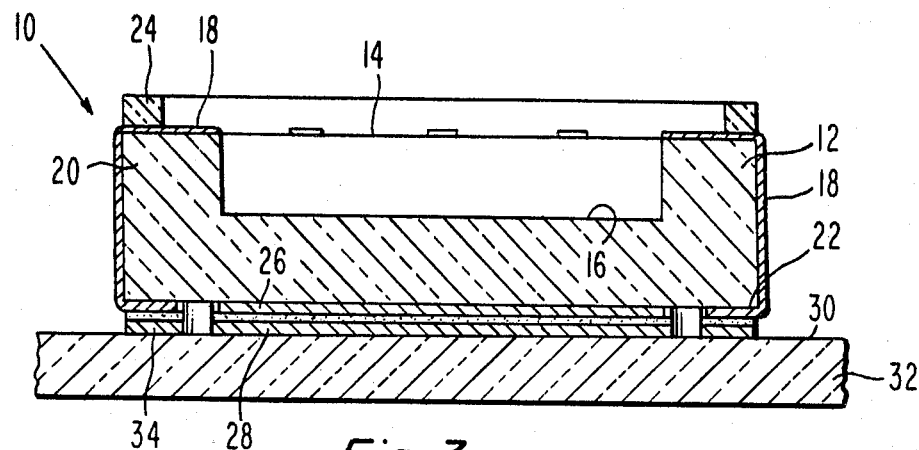
FIG. 3 is a partial cross-sectional view of the surface mounted package of FIGS. 1 and 2 mounted to a circuit board according to the principles of the present invention.

Another thermal buffer pad 28 is formed as part of the connector on a surface upon which the package 10 is to be mounted. The thermal buffer pad 28 also preferably has a coefficient of thermal expansion between that of the package 10 and that of the surface to which it is to be mounted. Further, the thermal buffer pad 28 corresponds in size and relative location to the thermal buffer pad 26 on the package 10 and thus is preferably centrally located within the pattern of bonding areas of the printed circuit board. In one particular example, as shown in FIG. 3, the package 10 is mounted on a surface 30 of a printed circuit board (PCB) 32 also having a plurality of contacts 34 thereon. In most instances the PCB 32 is initially copper clad and the thermal buffer pad 28 can be formed thereon by making minor changes in the circuit etching masks. If the PCB 32 is not initially copper clad the thermal buffer pad 28 can be formed simultaneously with the circuit, using known techniques.

The package 10, via the contacts 18 and 34 and the thermal buffer pads 26 and 28 is mounted to the PCB 32 by, for example, using known soldering techniques, such as conventional 60-40 lead/tin solder at a soldering temperature of about 215° C. Because the thermal buffer pads 26 and 28 are copper they are quite compatible with these known techniques.

Figure 4:
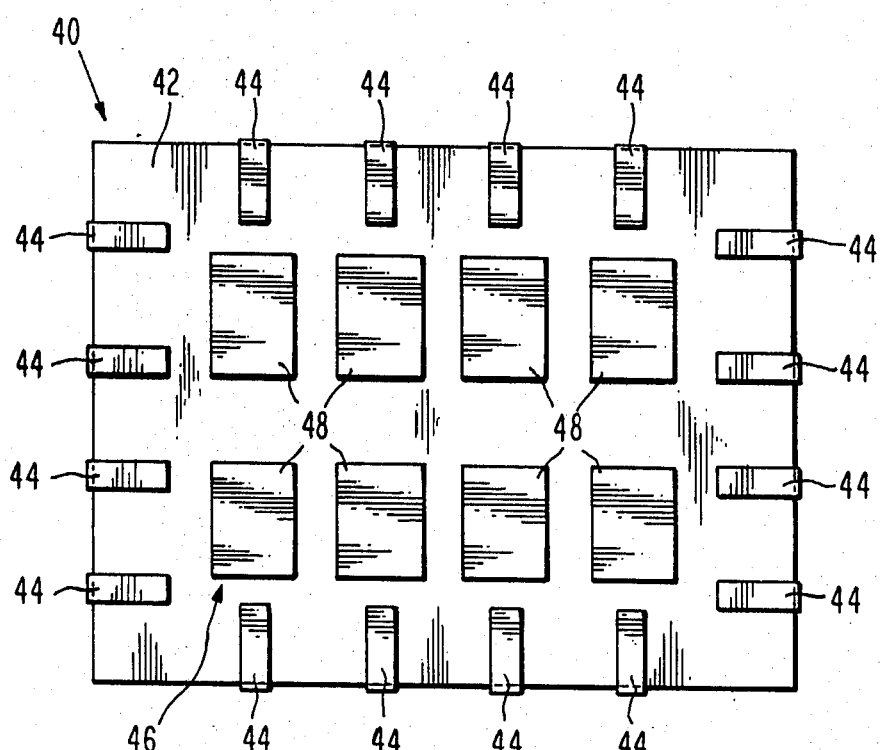
FIG. 4 is a plan view of the mounting surface of another surface mounted package at an intermediate stage of a mounting method embodying the principles of the present invention.

As is well known in the art, when any two items are to be soldered they should be pretinned, i.e. each item should have a layer of solder formed thereon prior to being joined at the soldering temperature. Pretinning of the thermal buffer pads 26 and 28 on the package 10 and the PCB 32, respectively, is difficult to do using liquid solder when those pads 26 and 28 have a significant area because an excessive amount of solder tends to cling thereto due to the cohesive forces of the solder. This difficulty can be overcome by plating the pads with solder or forming the thermal buffer pads as shown in an alternative package 40 illustrated in FIG. 4. In FIG. 4 a surface mounted package 40 having second surface 42 and a plurality of contacts 44 includes a thermal buffer pad 46. The thermal buffer pad 46 in this instance however, comprises a plurality of sub-pads 48 which can be formed by methods similar to those described above. Advantageously, due to their relatively smaller sizes, the cohesive forces of solder clinging to the sub-pads 48 is considerably less than those forces when the comparatively larger thermal buffer pad 26 is used. Although only the thermal buffer pad 46 of the package 40 is illustrated, it will be readily understood that a pattern corresponding to that of sub-pads 48 can be formed on a circuit board to which the package 40 is to be mounted.

It has been determined that, by using the method described above, a surface mounted package (10) can be mounted on a circuit board (32) and be capable of withstanding severe thermal shocks. Mountings so formed have been successfully tested under the following conditions:

Electrical contact pad (18) size: 0.05 cm×0.1 cm
Thermal buffer pad (28) size: 0.9 cm×0.9 cm
Temperature Range: −55° C. to 125° C.
Time at Temperature: 5 minutes hot, 5 minutes cold
Transfer Time between Temperatures: less than 8 seconds With mounted packages without the thermal buffer pad in the connector, after 50 to 70 temperature cycles as above, electrical continuity of the bonds was maintained, but under 50× (50 times) magnification a definitive crack appeared at the heel of the package where the solder fillet was viewable in a non-destructive test. With mounted packages having the thermal buffer pad in the connector as described, between 200 and 300 temperature cycles as above were required before a definitive crack appeared at 50× magnification (these cracks were in the same location as with the old connectors). This four to six fold increase in bond durability under these test conditions constitutes a very significant increase in system reliability and demonstrates the superior performance of these connectors and this mounting technique.

Figure 5:
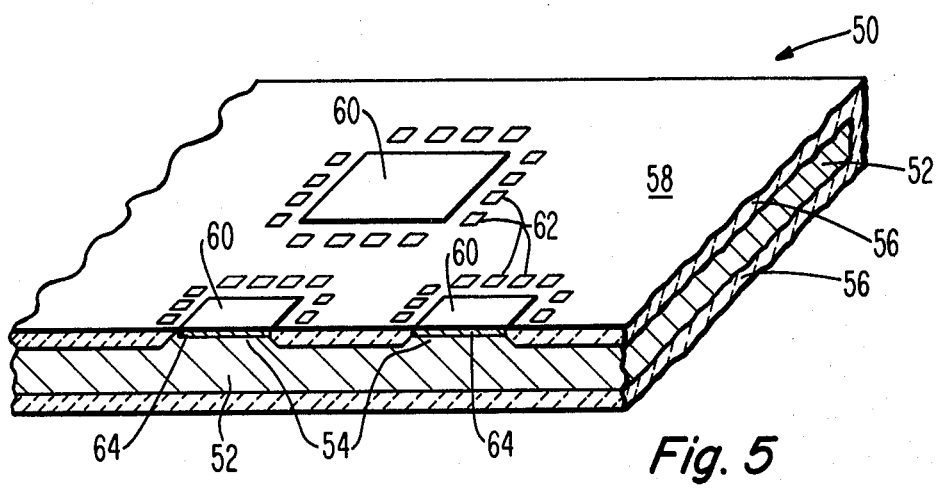
FIG. 5 is a perspective, partially cut-away view of an embodiment of the invention involving a porcelainized metal circuit board.

While the precise reasons for the improved bond are not totally understood, one explanation is that since copper has a coefficient of thermal expansion of about $16.8 \times 10^{-6}$ cm/cm°C. which is between that of alumina, $6.6 \times 10^{-6}$ cm/cm/°C. and the material of the PCB 32, $20 \times 10^{-6}$ cm/cm/°C., the copper thermal buffer pads 26 and 28 reduce or absorb the thermal stress at the alumina/PCB interface. More particularly, for the package of FIG. 2 having the dimensions discussed above, the PCB will expand $13.4 \times 10^{-6}$ cm/°C. more than alumina will. Thus, for a 180° temperature change, the PCB between the end contact pads will expand or contract approximately $2.5 \times 10^{-3}$ centimeters further than the alumina. In the absence of the thermal buffer pad this relatively large displacement over a moderate number of cycles is sufficient to fracture some of the bonds. In contrast, in the presence of the thermal buffer pads, if the thermal buffer pads are assumed to remain stationary, then the PCB's greater thermal expansion of $13.4 \times 10^{-6}$ cm/°C. only acts over a distance of 0.1 centimeters with the result that the maximum displacement is $2.412 \times 10^{-4}$ centimeters. The result is a substantial reduction in both relative displacement and the forces exerted with the result that the contact pad bonds survive many more cycles. The results of using the disclosed method can also be explained in terms of the area of contact between the package 10 and the PCB 32. That is, there is a larger physical bonded area when thermal buffer pads 26 and 28 are used than when they are not. The thermal stress between the package 10 and the PCB 32, while strong enough to fracture the bonds at the relatively small mounting pads 18 (in the absence of thermal buffer pads), is insufficient to fracture those bonds when a larger area bond, i.e., between the thermal buffer pads 26 and 28, is present. Still further, since the interface between the ceramic base 12 and the thermal buffer pad 26 is an extremely strong bond and the interface between the thermal buffer pad 28 and the PCB 32 is also an extremely strong bond, the solder connection between the thermal buffer pads 26 and 28 provides a bond which is comparatively much stronger than the forces required to fracture the bonds of just the pads 18.

Where the circuit board is a porcelainized metal sheet (usually steel), the thermal buffer pad area of the board may preferably comprise a non-porcelainized portion of the steel sheet. The pad area preferably has an exposed surface which is substantially co-planar with the exposed surface of the porcelain. Thus, in FIG. 5 a porcelainized steel board 50 has a steel substrate 52 coated with porcelain 56 everywhere except in the areas where thermal buffer pads 60 are located. In these areas, the inner metal is left exposed or uncoated by the porcelain. In order to make the surface of the pads 60 substantially co-planar with the surface 58 of the porcelain 56, substrate 52 includes raised portions 54 at the pad locations. Raised portions 54 may be created in any appropriate manner including milling away the other portions of the surface of a uniform thickness metal sheet, rolling or stamping with a die and so forth. Electrical contact pads and conducting lines are printed on the surface of the porcelain in whatever pattern is appropriate. Electrical contact pads 62 are illustrated. Where the substrate 52 is steel, the thermal buffer pad preferably includes a copper layer 64 overlying the non-porcelainized steel within the buffer pad area.

It is preferred that the thermal buffer pad be electrically isolated from the electrical contact pads in order to avoid introducing undesired stray or parasitic elements into the circuit. However, the thermal buffer pad may have a dual purpose and serve as one of the electrical contacts, if desired. Similarly, although a solid pad has been illustrated and described, in some circumstance the central portion of the pad or sub-pad may be omitted. Those skilled in the art will be able to make other changes and modifications without departing from the scope of the invention as defined in the claims.

What is claimed is:

1. A connector, for securing a surface mounted package of the type having a first plurality of electrical contact pads on one surface thereof to a circuit board of the type having a second plurality of electrical contact pads on one surface thereof, said first plurality of electrical contact pads corresponding in size and relative location to said second plurality of electrical contact pads, when aligned for bonding, said connector being adapted for use with a surface mounted package having a different coefficient of thermal expansion than the circuit board to which it is attached and comprising:

first thermal buffer pad means on said one surface of said surface mounted package;
    second thermal buffer pad means on said one surface of said circuit board, said first and second thermal buffer pads being configured to have their bonding areas aligned when said first and second pluralities of electrical contact pads are aligned and said first and second thermal buffer pad means each having a substantially larger bonding area than one of said plurality of electrical contacts;
    said thermal buffer pads have coefficients of thermal expansion which are intermediate those of said surface mounted package and said circuit board; and
    means between corresponding members of said first plurality of electrical contact pads and said second plurality of electrical contact pads and between said first thermal buffer pad means and said second thermal buffer pad means for bonding each pad of the surface mounted package to the aligned pad of the circuit board with the electrical contacts on said package electrically connected to said corresponding electrical contacts on said circuit board.

2. The connector recited in claim 1 wherein said bonding areas of said first and second thermal buffer pad means are each substantially larger than the bonding area of any other pads in said connector.

3. A connector as recited in claim 1 wherein each of said electrical contacts has substantially the same area.

4. A connector as recited in claim 1 wherein said thermal buffer pad and said plurality of contacts of said package are electrically isolated.

5. A connector as recited in claim 1 wherein said thermal buffer pad of said package comprises a plurality of sub-pads.

6. A connector as recited in claim 1 wherein said coefficients of thermal expansion of said thermal buffer pads of said package and of said board are equal.

7. A connector as recited in claim 6 wherein said package is alumina, said board is a glass-epoxy, and said thermal buffer pads are copper.

8. A connector as recited in claim 1 wherein said board is porcelainized metal and the thermal buffer pad area of said board is not porcelainized.

9. A connector as recited in claim 8 wherein said board is steel and said thermal buffer pad area of said board further includes a layer of copper overlying said non-porcelainized steel.

10. A connector as recited in claim 1 wherein said thermal buffer pad has an effective contact area which is at least 10 times the effective contact area of one of the electrical contact pads.

11. The connector recited in claim 1 wherein:
    said first thermal buffer pad is centrally located within the pattern of said electrical contact pads of said surface mounted package.

12. A surface mounted package connector for securing a surface mounted package of the type having a first plurality of electrical contact pads on one surface thereof to a circuit board of the type having a second plurality of electrical contact pads on one surface thereof, said first plurality of electrical contact pads corresponding in size and relative location to said second plurality of electrical contact pads, when aligned for bonding, said connector adapted for use in connecting a surface mounted package to a circuit board having a different coefficient of thermal expansion, said connector comprising:

said first plurality of electrical contact pads each having an area of about A cm$^2$ and being disposed along the outline of a first geometric figure;
    a first thermal buffer pad disposed on said one surface of said surface mounted package and having a bonding area of more than 150 A cm$^2$;
    said second plurality of electrical contact pads each having an area of about A cm$^2$ and being disposed along the outline of a second geometric figure to align with said first plurality of electrical contact pads;
    a second thermal buffer pad disposed on said one surface of said circuit board and having a bonding area of more than 150 A cm$^2$;
    said first thermal buffer pad disposed within said first outline and proximate to said first plurality of electrical contact pads and said second thermal buffer pad disposed within said second outline and proximate to said second plurality of electrical contact pads for limiting the forces to which said electrical contact pads and their bonds will be exposed when said surface mounted package and the circuit board are thermally cycled;

said thermal buffer pads having coefficients of thermal expansion which are intermediate those of said surface mounted package and said circuit board; and means between corresponding members of said first plurality of electrical contact pads and said second plurality of electrical contact pads and between said first thermal buffer pad and said second thermal buffer pad for bonding each pad of the surface mounted package to the aligned pad of the circuit board with the electrical contacts on said package electrically connected to said corresponding electrical contacts on said circuit board.

13. A method of mounting a surface mounted package to a circuit board having a different coefficient of thermal expansion, said method comprising the steps of:

forming a first thermal buffer pad on a surface of said package, said surface having a plurality of contacts thereon;

forming a second thermal buffer pad on a surface of said circuit board, said circuit board surface having a plurality of contacts thereon; said second thermal buffer pad and said contacts of said circuit board substantially corresponding in size and relative location to said first thermal buffer pad and said contacts on said package;

said thermal buffer pads having coefficients of thermal expansion which are intermediate those of said surface mounted package and said circuit board; and rigidly affixing said package to said board via said contacts and said thermal buffer pads.

14. A method as claimed in claim 13 wherein said affixing step comprises soldering said package to said board using 60-40 lead/tin solder at a temperature of about 215° C.

15. A method as claimed in claim 14 further comprising the step of pretinning said contacts and said first and second thermal buffer pads.

16. A method as claimed in claim 13, wherein said first thermal buffer pad forming step comprises silk screening copper onto said surface of said package; and firing said copper at about 600° C. for about 10 minutes.

17. A connector, for securing a surface mounted package of the type having a first plurality of electrical contact pads on one surface thereof to a circuit board of the type having a second plurality of electrical contact pads on one surface thereof, said first plurality of electrical contact pads corresponding in size and relative location to said second plurality of electrical contact pads, when aligned for bonding, said connector comprising:

first thermal buffer pad means on said one surface of said package, said first thermal buffer pad centrally located within the pattern of said electrical contact pads of said package;

second thermal buffer pad means on said one surface of said circuit board, said first and second thermal buffer pads being configured to have their bonding areas aligned when said first and second pluralities of electrical contact pads are aligned and said first and second thermal buffer pad means each having a substantially larger bonding area than one of said plurality of electrical contacts; and means between corresponding members of said first plurality of electrical contact pads and said second plurality of electrical contact pads and between said first thermal buffer pad means and said second thermal buffer pad means for bonding the surface mounted package to the circuit board with the electrical contact pads on said surface mounted package electrically connected to said corresponding electrical contact pads on said circuit board and said first thermal buffer pad means physically connected to said second thermal buffer pad means.

* * * * *

UNITED STATES PATENT AND TRADEMARK OFFICE
CERTIFICATE OF CORRECTION

PATENT NO. : 4,417,296

DATED : November 22, 1983

INVENTOR(S) : Schelhorn

It is certified that error appears in the above-identified patent and that said Letters Patent is hereby corrected as shown below:

On the Title page in the lefthand column following
"[76] Inventor ..." insert as a new line:
--[73] Assignee: RCA Corporation, Princeton, N.J.--;

On the Title page in the lefthand column, the filing date should read --September 26, 1980--.

On the Title page in the righthand column following:
"Primary Examiner - R. R. Kucia" insert as a new line
--Attorney, Agent or Firm - Joseph S. Tripoli; Robert Ochis--.

Signed and Sealed this

Twenty-fourth Day of February, 1987

Attest:

DONALD J. QUIGG

*Attesting Officer*　　　*Commissioner of Patents and Trademarks*